(12) United States Patent
Shiratori

(10) Patent No.: US 9,620,569 B2
(45) Date of Patent: Apr. 11, 2017

(54) LIGHT-EMITTING DEVICE AND ELECTRONIC APPARATUS

(71) Applicant: SEIKO EPSON CORPORATION, Tokyo (JP)

(72) Inventor: Koya Shiratori, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 205 days.

(21) Appl. No.: 14/691,014

(22) Filed: Apr. 20, 2015

(65) Prior Publication Data

US 2016/0025302 A1    Jan. 28, 2016

(30) Foreign Application Priority Data

Jul. 25, 2014  (JP) ................................ 2014-151564

(51) Int. Cl.
*H01L 27/32* (2006.01)
*H01L 51/52* (2006.01)

(52) U.S. Cl.
CPC ........ *H01L 27/322* (2013.01); *H01L 27/3213* (2013.01); *H01L 51/5265* (2013.01)

(58) Field of Classification Search
CPC  H01L 27/322; H01L 27/3213; H01L 51/5265
See application file for complete search history.

(56) References Cited

U.S. PATENT DOCUMENTS

| 7,072,003 B2 * | 7/2006 | Stahl ................... H04N 9/3105 |
| | | 348/E9.027 |
| 2002/0154257 A1* | 10/2002 | Iijima ............... G02F 1/133514 |
| | | 349/67 |
| 2006/0012288 A1 | 1/2006 | Terakado et al. |
| 2008/0135858 A1 | 6/2008 | Yamazaki et al. |
| 2009/0085478 A1 | 4/2009 | Cok et al. |
| 2009/0091238 A1 | 4/2009 | Cok et al. |
| 2009/0153036 A1* | 6/2009 | Gonda ................ H01L 51/5265 |
| | | 313/504 |

FOREIGN PATENT DOCUMENTS

| JP | 2006-012793 A | 1/2006 |
| JP | 2006-032010 A | 2/2006 |
| JP | 2010-541160 A | 12/2010 |
| JP | 2010-541180 A | 12/2010 |
| JP | 2012-028058 A | 2/2012 |

\* cited by examiner

*Primary Examiner* — David V Bruce
(74) *Attorney, Agent, or Firm* — Oliff PLC

(57) ABSTRACT

A light-emitting device includes a first pixel, a second pixel, and a third pixel. The first pixel includes a first light-emitting element that emits light in a first wavelength range. The second pixel includes a second light-emitting element that emits light in a fourth wavelength range that is different from the first wavelength range and that includes a second wavelength range and a third wavelength range and a first color filter that transmits light in the second wavelength range emitted from the second light-emitting element. The third pixel includes a third light-emitting element that emits light in the fourth wavelength range and a second color filter that transmits light in the third wavelength range emitted from the third light-emitting element.

20 Claims, 11 Drawing Sheets

SPECTRAL CHARACTERISTIC OF LIGHT EMITTED FROM FIRST LIGHT-EMITTING ELEMENT 20A
SPECTRAL CHARACTERISTIC OF LIGHT EMITTED FROM SECOND LIGHT-EMITTING ELEMENT 20B (20C)
TRANSMITTANCE CHARACTERISTIC OF FIRST COLOR FILTER 34A
TRANSMITTANCE CHARACTERISTIC OF SECOND COLOR FILTER 34B

FIG. 10
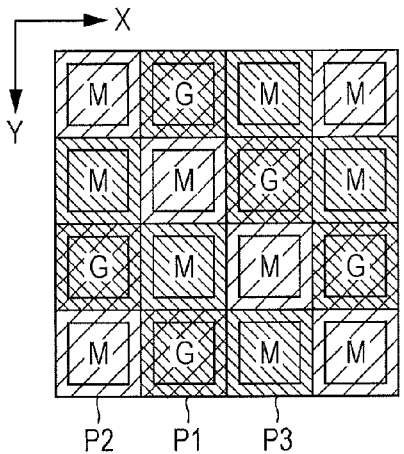
P2  P1  P3
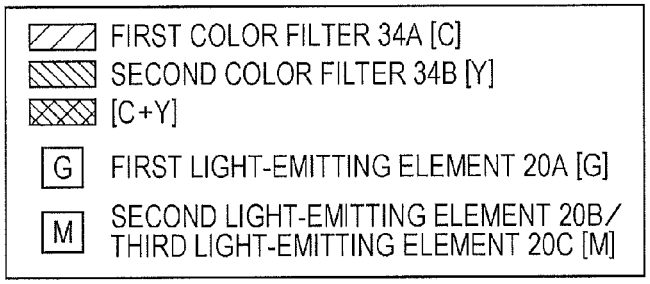
FIG. 11
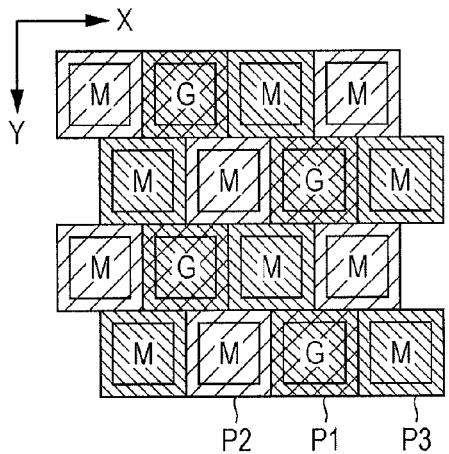
P2  P1  P3
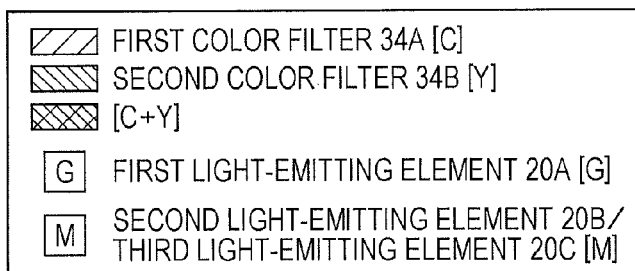

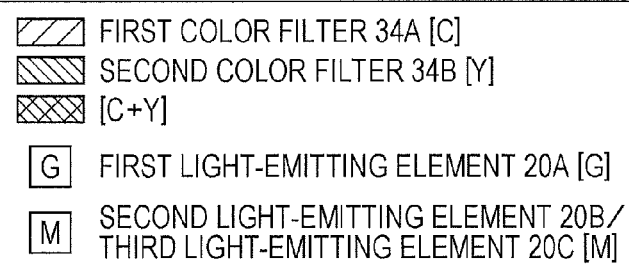

LIGHT-EMITTING DEVICE AND ELECTRONIC APPARATUS

BACKGROUND

1. Technical Field

The present invention relates to a technique for displaying images using a light-emitting element such as an organic EL element.

2. Related Art

Light-emitting devices which display color images using light-emitting elements and color filters have been proposed. For example, JP-A-2006-32010 discloses a structure in which color filters of RGB colors (red, green, and blue) are formed for white light-emitting elements to display color images. JP-A-2012-28058 discloses a structure for generating three colors of RGB by a combination of three types of light-emitting elements emitting colors of RGB and three types of color filters which transmit respective colors of CMY (cyan, magenta, and yellow).

SUMMARY

In techniques in JP-A-2006-32010 and JP-A-2012-28058, since three types of color filters for different colors need to be formed separately, a formation process of color filters and a structure of a light-emitting device are complicated. Therefore, an advantage of some aspects of the invention is that a formation process of a color filter and a structure of a light-emitting device are simplified.

A light-emitting device according to a first aspect of the invention includes a first pixel, a second pixel, and a third pixel. The first pixel includes a first light-emitting element that emits light in a first wavelength range. The second pixel includes a second light-emitting element that emits light in a fourth wavelength range that is different from the first wavelength range and that includes a second wavelength range and a third wavelength range and a first color filter that transmits light in the second wavelength range emitted from the second light-emitting element. The third pixel includes a third light-emitting element that emits light in the fourth wavelength range and a second color filter that transmits light in the third wavelength range emitted from the third light-emitting element. In this structure, light in the first wavelength range is emitted from the first light-emitting element in the first pixel, while light in the second wavelength range, which is included in light in the fourth wavelength range emitted from the second light-emitting element, is transmitted through the first color filter and light in the third wavelength range, which is included in light in the fourth wavelength emitted from the third light-emitting element, is transmitted through the second color filter. In short, through a combination of two types of light-emitting elements which emit light of different wavelength ranges and two types of color filters which transmit light of different wavelength ranges, pixels of three colors can be realized. Therefore, compared to techniques according to JPA-2006-32010 and JP-A-2012-28058 where three types of color filters which transmit light of different wavelength ranges are needed, a formation process of color filters and a structure of a light-emitting device are simplified.

It is preferable that the first light-emitting element, the second light-emitting element, and the third light-emitting element include a resonance structure in which a reflective layer and a transflective layer face each other with a light-emitting layer between the reflective layer and the transflective layer. In this structure, an emission color of a light-emitting layer in the first light-emitting element, the second light-emitting element, and the third light-emitting element can be the same (typically, white light). Therefore, a structure can be simplified compared to a structure where light-emitting layers of the first light-emitting element and the second light-emitting element (and the third light-emitting element) are separately formed to have different emission colors.

It is preferable that an optical path length between the reflective layer and the transflective layer in the second light-emitting element and the third light-emitting element be the same and set in a manner such that in a light spectrum of light emitted from the second light-emitting element and the third light-emitting element, a peak corresponding to a first resonance order is located in the second wavelength range, and a peak corresponding to a second resonance order that is different from the first resonance order is located in the third wavelength range. In this case, by selecting the optical path length between the reflective layer and the transflective layer in the second light-emitting element and the third light-emitting element as appropriate, light with peaks of spectrum in each of the second wavelength range and the third wavelength range can be easily generated. When each of the second wavelength range and the third wavelength range has a peak in spectrum, a structure in which the first wavelength range is located between the second wavelength range and the third wavelength range can be realized, for example.

It is preferable that the second light-emitting element and the third light-emitting element emit light of a spectrum with a single peak across the second wavelength range and the third wavelength range. In this case, the second light-emitting element and the third light-emitting element are formed so that light of a spectrum with a single peak across the second wavelength range and the third wavelength range is emitted. Accordingly, compared to the structure described above where the second light-emitting element and the third light-emitting element need to be formed to emit light with peaks in both the second wavelength range and the third wavelength range, formation requirements (such as restriction on the optical path length) for the second light-emitting element and the third light-emitting element can be relaxed.

In this case, light in the second wavelength range, which is included in light emitted from the second light-emitting element, is transmitted through the first color filter and light in the third wavelength range, which is included in light emitted from the third light-emitting element, is transmitted through the second color filter. If, for example, a spectrum of light emitted from the second light-emitting element and the third light-emitting element only covers a narrow range of an area in the vicinity of a border between the second wavelength range and the third wavelength range, it is difficult to obtain a sufficient amount of light transmitted through the first color filter (i.e., luminance of the second pixel) and a sufficient amount of light transmitted through the second color filter (i.e., luminance of the third pixel). Therefore, in order to sufficiently obtain the luminance of the second pixel and the third pixel, a spectrum of light emitted from the second light-emitting element and the third light-emitting element preferably covers a wide area including both the second wavelength range and the third wavelength range. Specifically, it is preferable that light emitted from the second light-emitting element and the third light-emitting element have a spectrum with a full width at half maximum of 50 nm or more and 100 nm or less. In addition, a spectrum of emission light tends to cover a smaller area as the resonance order increases. With such a tendency into consideration, the optical path length between the reflective layer and the transflective layer is preferably set so that resonance corresponding to a resonance order m of 2 or less occurs. In addition, as a thickness of the transflective layer increases, a reflectance of the resonance structure increases and a spectrum of emission light tends to cover a smaller area. With such a tendency into consideration, the transflective layer is preferably formed to have a thickness of 2 nm or more and 10 nm or less. In those structures, a spectrum of light emitted from the second light-emitting element and the third light-emitting element covers a wide range, whereby the luminance of the second pixel and the third pixel can be sufficiently obtained.

It is preferable that at least one of the first color filter and the second color filter transmit light in the first wavelength range and overlap the first light-emitting element. In this structure where at least one of the first color filter and the second color filter transmits light in the first wavelength range, even when at least one of the first color filter and the second color filter overlaps the first light-emitting element, light emitted from the first light-emitting element is transmitted through the color filter. In other words, even when the first color filter or the second color filter is misaligned, the light emitted from the first light-emitting element is not affected. Therefore, compared to a structure where alignment is required with high accuracy, a formation process of the color filter can be simplified. In addition, in a structure where at least one of the first color filter and the second color filter overlaps the first light-emitting element, compared to a structure where the light-emitting element does not overlap the color filter, an alignment margin increases, which leads to reduction in cost.

It is preferable that a partition be formed between the first color filter and the second color filter. In this structure, the first color filter and the second color filter are separated by the partition. Therefore, the first color filter is less likely to overlap the third light-emitting element and the second color filter is less likely to overlap the second light-emitting element.

It is preferable that a distance between the second light-emitting element and the third light-emitting element be greater than a distance between the first light-emitting element and the second light-emitting element and a distance between the first light-emitting element and the third light-emitting element. In this structure, the first to third light-emitting elements are formed in a manner such that the distance between the second light-emitting element and the third light-emitting element is greater than the distance between the first light-emitting element and the second light-emitting element and the distance between the first light-emitting element and the third light-emitting element. Accordingly, the first color filter is less likely to overlap the third light-emitting element and the second color filter is less likely to overlap the second light-emitting element.

A light-emitting device according to the aspect is used in, for example, a display device for various electronic apparatuses. Specifically, a head mounted display device or an electronic view finder for an image taking device can be given as preferred application examples of an electronic apparatus according to a second aspect of the invention, although an application range of the invention is not limited to those examples.

BRIEF DESCRIPTION OF THE DRAWINGS

The invention will be described with reference to the accompanying drawings, wherein like numbers reference like elements.

FIG. 10 illustrates an arrangement of color filters.

FIG. 11 illustrates an arrangement of color filters.

DESCRIPTION OF EXEMPLARY EMBODIMENTS

Embodiment 1

Figure 1:
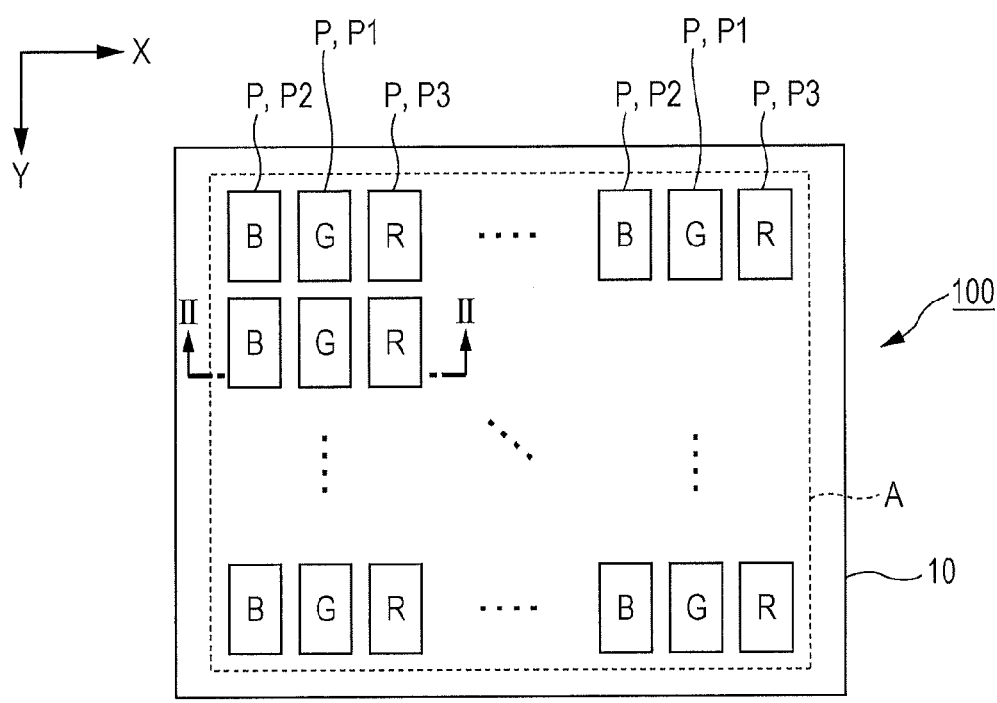
FIG. 1 is a plan view of a light-emitting device according to Embodiment 1 of the invention.

FIG. 1 is a plan view illustrating a light-emitting device 100 according to Embodiment 1 of the invention. The light-emitting device 100 according to Embodiment 1 is an organic EL device in which a light-emitting element including an organic EL material is formed on a substrate 10. The light-emitting device 100 includes a display region A in which a plurality of pixels (sub-pixels) P are arranged in matrix along an X-direction and Y-direction which intersect with each other. The pixels P in the display region A include three types of pixels P (P1, P2, and P3) for different display colors. Specifically, a pixel P1 emits light of a medium wavelength range which corresponds to a green (G) color, a pixel P2 emits light of a short wavelength range which corresponds to a blue (B) color, and a pixel P3 emits light of a long wavelength range which corresponds to a red (R) color. The pixel P1, the pixel P2, and the pixel P3 form one dot of a display image. A drive circuit (not illustrated) drives the pixels P, whereby color images are displayed in the display region A. Note that a side of the substrate 10 to which light from the pixels P is emitted (the side which is viewed) is hereinafter referred to as "light emitting side".

Figure 2:
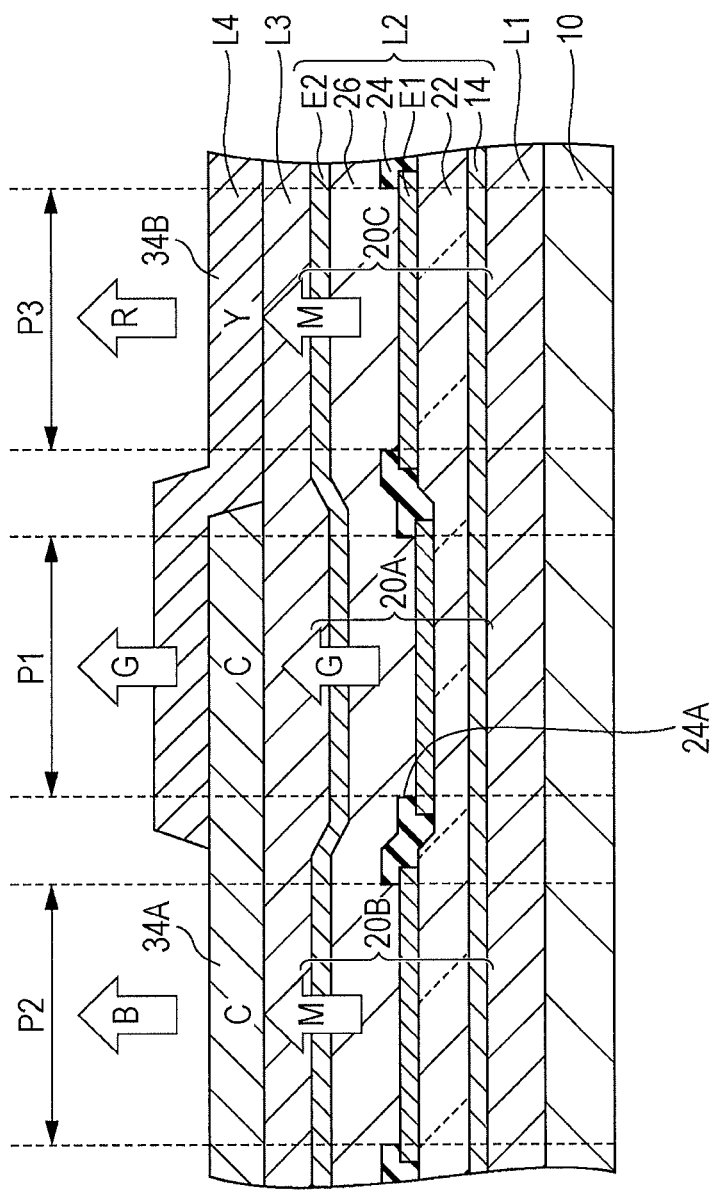
FIG. 2 is a cross-sectional view of a light-emitting device according to Embodiment 1.

FIG. 2 is a cross-sectional view illustrating the light-emitting device 100 according to Embodiment 1 (taken along the II-II line in FIG. 1). As illustrated in FIG. 2, the light-emitting device 100 has a structure in which an element formation layer L1, a light-emitting element layer L2, a sealing layer L3, and a wavelength selection layer L4 are stacked on the substrate 10.

The substrate 10 is a plate-like member formed using a semiconductor material such as silicon (i.e., a semiconductor substrate). The element formation layer L1 is formed on the substrate 10. The element formation layer L1 is a stack of a plurality of layers including a conductive layer and an insulating layer. In the element formation layer L1, active elements (e.g., a transistor for controlling current supplied to a light-emitting element or a transistor for writing a graduation level signal) or lines (e.g., a signal line or a power supply line) are formed for driving the pixels P.

The light-emitting element layer L2 is a layer for forming light-emitting elements 20 (20A, 20B, and 20C) of different pixels P. Specifically, a first light-emitting element 20A, a second light-emitting element 20B, and a third light-emitting element 20C are formed in the light-emitting element layer L2. The sealing layer L3 is a light-transmitting film-like member formed on the light-emitting element layer L2 and seals elements on the substrate 10 to prevent entry of outside air or moisture. Note that although a specific characteristic of the sealing layer L3 (a gas barrier characteristic) is not limited as long as a plurality of light-emitting elements 20 are protected from oxygen, moisture, or the like of the air, the oxygen permeability of the sealing layer L3 is preferably 0.01 cc/m$^2$/day or less, and the moisture permeability is preferably 7×10$^{-3}$ g/m$^2$/day or less, more preferably 5×10$^{-4}$ g/m$^2$/day or less, further more preferably 5×10$^{-6}$ g/m$^2$/day or less. Further, the light transmittance of the sealing layer L3 is preferably 80% or more. The wavelength selection layer L4 is an optical filter which selects a particular wavelength range from light emitted from the light-emitting elements 20 and is formed on the sealing layer L3 (on the light emitting side of the light-emitting element layer L2). The wavelength selection layer L4 according to Embodiment 1 includes a first color filter 34A and a second color filter 34B which transmit light of different wavelength ranges from each other.

The pixel P1 includes the first light-emitting element 20A. The pixel P2 includes the second light-emitting element 20B and the first color filter 34A. The pixel P3 includes the third light-emitting element 20C and the second color filter 34B. A specific structure and an optical characteristic of the light-emitting element layer L2 and the wavelength selection layer L4 are described in detail below.

The light-emitting element layer L2 includes a reflective layer 14, an optical path adjustment layer 22, a plurality of first electrodes E1, a pixel definition layer 24, a light-emitting functional layer 26, and a second electrode E2. The reflective layer 14 is a thin film which is formed of a light reflective material containing silver, aluminum, or the like on the element formation layer L1. The light reflectivity of the reflective layer 14 is preferably 40% or more, more preferably, 80% or more. The optical path adjustment layer 22 is formed of a light-transmitting insulating material on the reflective layer 14. The first electrode E1 is formed for each of the pixels P on the optical path adjustment layer 22. The first electrode E1 is an electrode formed of a light-transmitting conductive material such as indium tin oxide (ITO) and is electrically connected to an active element or a line in the element formation layer L1. The light transmittance of the first electrode E1 is preferably 50% or more, more preferably 80% or more. A pixel definition layer 24 is formed on the optical path adjustment layer 22 on which the plurality of the first electrodes E1 are formed. The pixel definition layer 24 has a planar lattice shape in plan view with openings 24A corresponding to the pixels P (or the first electrodes E1) and is formed of an insulating material such as a silicon compound (typically, silicon nitride or silicon oxide).

On the optical path adjustment layer 22 on which the plurality of first electrodes E1 and the pixel definition layer 24 are formed, the light-emitting functional layer 26 which is continuous across the plurality of pixels P is formed in the whole area of the display region A. The light-emitting functional layer 26 includes a light-emitting layer of an organic EL material and emits white light when supplied with current. Note that the light-emitting functional layer 26 may include a transportation layer or an injection layer for electrons and holes to be supplied to the light-emitting layer. The second electrode E2 which is continuous across the plurality of pixels P is formed on the light-emitting functional layer 26. The second electrode E2 is a transflective layer which transmits a part of incoming light and reflects the rest of the incoming light. For example, the second electrode E2 having both light-transmitting and light-reflective characteristics is a sufficiently thin film of a light-reflective material containing silver, aluminum, or the like (such as an alloy of magnesium and silver). The light transmittance of the second electrode E2 is preferably 20% or more, more preferably 30% or more, while the light reflectivity of the second electrode E2 is preferably 20% or more, more preferably 50% or more. When current flows between the first electrode E1 and the second electrode E2, the light-emitting functional layer 26 emits white light.

The light-emitting element 20 is a region in which the reflective layer 14 and the second electrode E2 face each other with the optical path adjustment layer 22, the first electrode E1, and the light-emitting functional layer 26 interposed therebetween. Specifically, an inner region of the opening 24A in the pixel definition layer 24 in plan view serves as the light-emitting element 20. White light emitted from the light-emitting functional layer 26 in response to current which flows between the first electrode E1 and the second electrode E2 resonates between the reflective layer 14 and the second electrode E2. A part of the white light passes through the second electrode E2 and emits to the light emitting side (a side opposite to the substrate 10). As is understood from the above description, the light-emitting element 20 including a resonance structure which selectively emits light with a particular resonance wavelength is formed for each of the pixels P. As described above, the plurality of light-emitting elements 20 according to Embodiment 1 are classified into the first light-emitting element 20A, the second light-emitting element 20B, and the third light-emitting element 20C.

Figure 3:
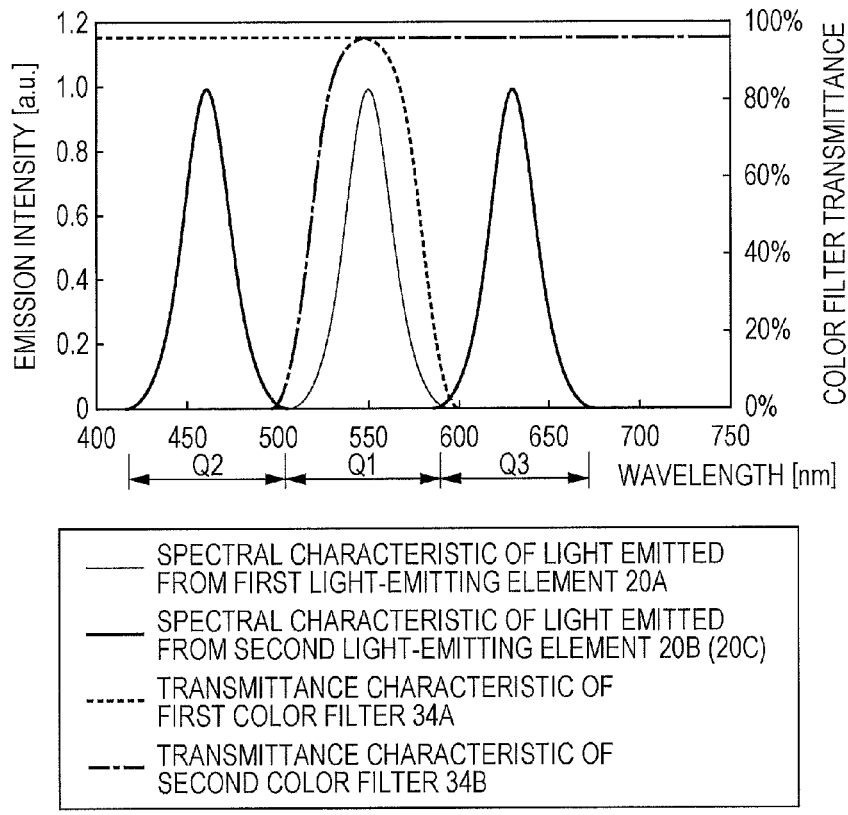
FIG. 3 illustrates optical characteristics of a light-emitting element and a color filter according to Embodiment 1.

FIG. 3 illustrates spectral characteristics of light emitted from each of the light-emitting elements 20. The first light-emitting element 20A emits light in a first wavelength range Q1. As illustrated in FIG. 3, the first wavelength range Q1 is a wavelength range of green (G) (specifically, 495 nm to 570 nm). The second light-emitting element 20B and the third light-emitting element 20C emit light in a fourth wavelength range Q4. The fourth wavelength range Q4 is different from the first wavelength range Q1. The color of the fourth wavelength range Q4 is a complementary color of the color of the first wavelength range Q1. Specifically, the fourth wavelength range Q4 includes a second wavelength range Q2 and a third wavelength range Q3. The second wavelength range Q2 is a wavelength range of blue (B), while the third wavelength range Q3 is a wavelength range of red (R). In other words, the fourth wavelength range Q4 is a wavelength range of magenta (M).

As described above, the light-emitting element 20 includes a resonance structure. In Embodiment 1, the thickness of the optical path adjustment layer 22 is adjusted for each of the light-emitting elements 20, whereby the resonance wavelength of the light-emitting element 20 (that is, the wavelength range of emitted light) is selected. Specifically, the thickness of a part of the optical path adjustment layer 22 which is in the region of the first light-emitting element 20A is adjusted so that the resonance wavelength is located in the first wavelength range Q1, while the thickness of a part of the optical path adjustment layer 22 which is in the region of the second light-emitting element 20B and the third light-emitting element 20C is adjusted so that the resonance wavelengths are located in the second wavelength range Q2 and the third wavelength range Q3.

FIG. 3 also illustrates transmittance characteristics of the first color filter 34A and the second color filter 34B. The first color filter 34A is formed on a light emitting side of the second light-emitting element 20B. As illustrated in FIG. 3, the first color filter 34A is a colored layer of cyan (C) which transmits light in the second wavelength range Q2 and at least a part of the first wavelength range Q1 (i.e., the first color filter 34A absorbs light in the third wavelength range Q3). In Embodiment 1, the transmittance characteristic of the first color filter 34A is set so that light emitted from the first light-emitting element 20A passes therethrough. On the other hand, the second color filter 34B is formed on a light emitting side of the third light-emitting element 20C. The second color filter 34B is a colored layer of yellow (Y) which transmits light in the third wavelength range Q3 and at least a part of the first wavelength range Q1 (i.e., the second color filter 34B absorbs light in the second wavelength range Q2). In Embodiment 1, the transmittance characteristic of the second color filter 34B is set so that light emitted from the first light-emitting element 20A passes therethrough.

As described above, the pixel P2 includes the second light-emitting element 20B and the first color filter 34A. The second light-emitting element 20B emits magenta light in the second wavelength range Q2 and the third wavelength range Q3. The first color filter 34A transmits light in the second wavelength range Q2 and at least a part of the first wavelength range Q1. Accordingly, as understood from FIG. 2, in magenta light emitted from the second light-emitting element 20B, a blue component in the second wavelength range Q2 is emitted from the pixel P2 to the light emitting side. The pixel P3 includes the third light-emitting element 20C and the second color filter 34B. The third light-emitting element 20C emits magenta light in the second wavelength range Q2 and the third wavelength range Q3. The second color filter 34B transmits light in the third wavelength range Q3 and at least a part of the first wavelength range Q1. Accordingly, in magenta light emitted from the third light-emitting element 20C, a red component in the third wavelength range Q3 is emitted from the pixel P3 to the light emitting side.

The pixel P1 includes the first light-emitting element 20A which emits green light in the first wavelength range Q1. In FIG. 2, an example is illustrated where the first color filter 34A and the second color filter 34B are formed on the light emitting side of the first light-emitting element 20A in the pixel P1.

As described above, light in the first wavelength range Q1 passes through the first color filter 34A and the second color filter 34B. Therefore, even if one or both of the first color filter 34A and the second color filter 34B are placed to overlap the first light-emitting element 20A, due to a manufacturing error, etc., green light emitted from the first light-emitting element 20A passes through the first color filter 34A and the second color filter 34B and is emitted to the light emitting side from the pixel P1. Accordingly, the first color filter 34A and the second color filter 34B are not regarded as essential elements of the pixel P1 but as elements which are optionally included in the pixel P1.

As described above, according to Embodiment 1, through a combination of two types of light-emitting elements 20 which emit light of different wavelength ranges (i.e., the first light-emitting element 20A and the second and third light-emitting elements 20B and 20C), and two types of color filters 34 which transmit light of different wavelength ranges (i.e., the first color filter 34A and the second color filter 34B), three type of pixels P which emit light of different wavelengths (i.e., the pixels P1, P2, and P3) can be realized.

As described above, the second and third light-emitting elements 20B and 20C emit magenta light in the second wavelength range Q2 and the third wavelength range Q3. In Embodiment 1, as described in detail below, in the resonance structure of each of the second light-emitting element 20B and the third light-emitting element 20C, an optical path length D between the reflective layer 14 and the second electrode (transflective layer) E2 is set as appropriate in a manner such that resonance of different resonance orders m (resonance of different resonance wavelengths λ) occur in parallel. In such a manner, magenta light in the second wavelength range Q2 and the third wavelength range Q3 can be emitted.

A relationship among the resonance order m, the resonance wavelength λ, and the optical path length D is represented by the formula (1) below. In the formula (1), $\phi_L$ represents a phase-shift amount due to reflection by the reflective layer 14 and $\phi_U$ represents a phase-shift amount due to reflection by the second electrode E2. The phase-shift amounts $\phi$ and ($\phi_L$ and $\phi_U$) are represented by the formula (2). In the formula (2), $n_1$ represents a refractive index of a medium between the reflective layer 14 and the second electrode E2. Specifically, $n_1$ represents a refractive index of a case where a medium including the optical path adjustment layer 22, the first electrode E1, and the light-emitting functional layer 26 is assumed to have an even quality throughout. In addition, $n_2$ represents a refractive index of the reflective layer 14 or the second electrode E2, and $k_2$ represents an extinction coefficient of the reflective layer 14 or the second electrode E2.

$$D = \left[\frac{(2\pi m + \phi_L + \phi_U)}{4\pi}\right]\lambda \quad (1)$$

$$\phi = \tan^{-1}\left[\frac{(2n_1 k_2)}{(n_1^2 - n_2^2 - k_2^2)}\right] \quad (2)$$

Figure 4:
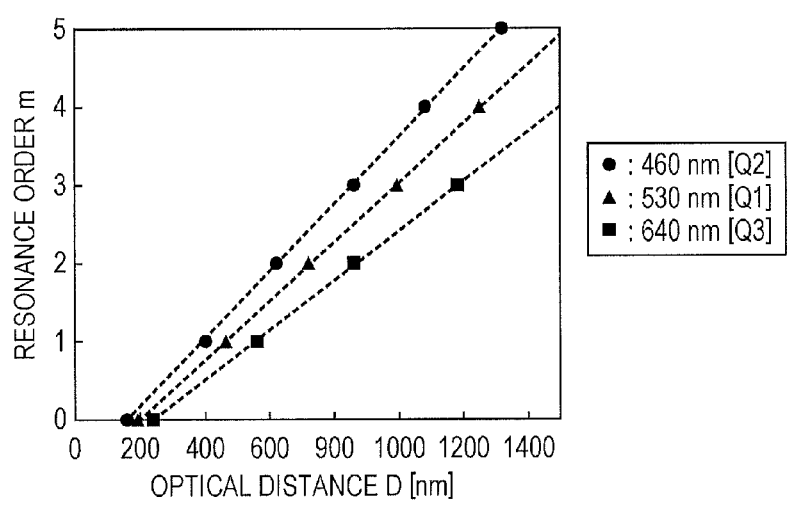
FIG. 4 illustrates an optical path length and a resonance order of a resonance structure.

FIG. 4 is a graph illustrating a relationship represented by Formula (1), that is, a relationship between the resonance orders m and the optical path lengths D with which resonance occurs at wavelengths of red, green, and blue. The optical path length D of FIG. 4 is calculated under the assumption that the refractive index $n_1$ is 1.8. As illustrated in FIG. 4, the optical path length D of between 550 nm and 650 nm causes a second resonance (m=2) of a blue wavelength (460 nm) within the second wavelength range Q2 and a first resonance (m=1) of a red wavelength (640 nm) within the third wavelength range Q3 in parallel. Therefore, by setting the thickness of the optical path adjustment layer 22 so that the optical path length D of the resonance structure is 550 nm to 650 nm in each of the second light-emitting element 20B and the third light-emitting element 20C, magenta light can be emitted from the second light-emitting element 20B and the third light-emitting element 20C as described above. Thus, the optical path length D of the resonance structure in each of the second light-emitting element 20B and the third light-emitting element 20C is set as appropriate in a manner such that a peak of a second resonance (m=2) is in the second wavelength range Q2 and a peak of a first resonance (m=1) is in the third wavelength range Q3 in a spectrum of light emitted from the second light-emitting element 20B and the third light-emitting element 20C. Note that, as illustrated in FIG. 4, when the optical path length D is set between 800 nm and 900 nm, a third resonance (m=3) of a blue wavelength and a second resonance (m=2) of a red wavelength occur in parallel. Therefore, when the optical path length D of the resonance structure in each of the second light-emitting element 20B and the third light-emitting element 20C is set between 800 nm and 900 nm, magenta light can also be emitted from the second light-emitting element 20B and the third light-emitting element 20C.

As described above, in Embodiment 1, the pixel P1 emits green light from the first light-emitting element 20A, the pixel P2 emits blue light that is included in magenta light from the second light-emitting element 20B and is transmitted through the first color filter 34A, and the pixel P3 emits red light that is included in magenta light from the third light-emitting element 20C and is transmitted through the second color filter 34B. In other words, by a combination of two types of light-emitting elements 20 (i.e., the first light-emitting element 20A and the second and third light-emitting elements 20B and 20C) which emit light of different wavelengths and two types of color filters 34 which transmit light of different wavelengths, three types of pixels P (i.e., the pixels P1, P2, and P3) which emit light of different wavelengths can be realized. Compared to a structure including three types of color filters as in techniques of JP-A-2006-32010 and JP-A-2012-28058, this structure is advantageous because a formation process of the color filters 34 and the structure of the light-emitting device 100 can be simplified. In addition, in a structure similar to that in Embodiment 1 where the both light-emitting element layer L2 and the wavelength selection layer L4 are formed on the single substrate 10, heat or the like which is generated in a formation process of the color filter 34 may affect the formed light-emitting element layer L2. In Embodiment 1 where two types of color filters 34 are formed, however, an effect of a formation process of the color filter 34 on the light-emitting element layer L2 can be reduced compared to a case where three types of color filters are formed.

In addition, the first color filter 34A transmits light in the second wavelength range Q2 as well as light in first wavelength range Q1, while the second color filter 34B transmits light in the first wavelength range Q1 as well as light in the third wavelength range Q3. Therefore, as illustrated in FIG. 2, even when the first color filter 34A and the second color filter 34B are formed on the light emitting side of the first light-emitting element 20A, green light in the first wavelength range Q1 emitted from the first light-emitting element 20A is transmitted through the first color filter 34A and the second color filter 34B to be emitted to the light emitting side. Thus, the first color filter 34A and the second color filter 34B which are formed on the second light-emitting element 20B and the third light-emitting element 20C have an alignment margin of a region of the first light-emitting element 20A. That is, according to Embodiment 1, compared to a case where the first color filter 34A and the second color filter 34B do not transmit light in the first wavelength range Q1, the first color filter 34A and the second color filter 34B have a larger alignment margin (i.e., a required level of accuracy for the formation is low). Thus, from the perspective described above, a formation process of the color filter can be simplified according to Embodiment 1.

In addition, since the first light-emitting element 20A, the second light-emitting element 20B, and the third light-emitting element 20C have a resonance structure where the reflective layer 14 and the second electrode E2 face each other with the light-emitting functional layer 26 therebetween, a color of light emitted from the light-emitting functional layer 26 of the first light-emitting element 20A can be the same as that of the second light-emitting element 20B and the third light-emitting element 20C. Therefore, compared to a case where the light-emitting functional layer 26 is formed with different materials so that the first light-emitting element 20A and the second light-emitting element 20B (and the third light-emitting element 20C) emit light of different colors, the structure can be simplified.

In the resonance structure of the second light-emitting element 20B and the third light-emitting element 20C, by setting the optical path length D between 550 nm and 650 nm, resonance in the second wavelength range Q2 of the resonance order m (m=2) and resonance in the third wavelength range Q3 of the resonance order m (m=1) occur in parallel, whereby magenta light can be easily generated. The same applies to a case where the optical path length D is set between 800 nm and 900 nm.

Embodiment 2

Embodiment 2 of the invention is now described. In Embodiment 1, emission light from the second light-emitting element 20B and the third light-emitting element 20C are generated by a resonance structure in which resonance of a resonance wavelength in the second wavelength range Q2 and resonance of a resonance wavelength in the third wavelength range Q3 occur in parallel. In Embodiment 2, light with a spectrum having a single peak covering the second wavelength range Q2 and the third wavelength range Q3 is emitted from the second light-emitting element 20B and the third light-emitting element 20C. Note that in the following examples, with regard to elements having a similar effect or function to those of Embodiments 1, reference numerals in Embodiment 1 are used and detailed description of such elements is omitted as appropriate.

Figure 5:
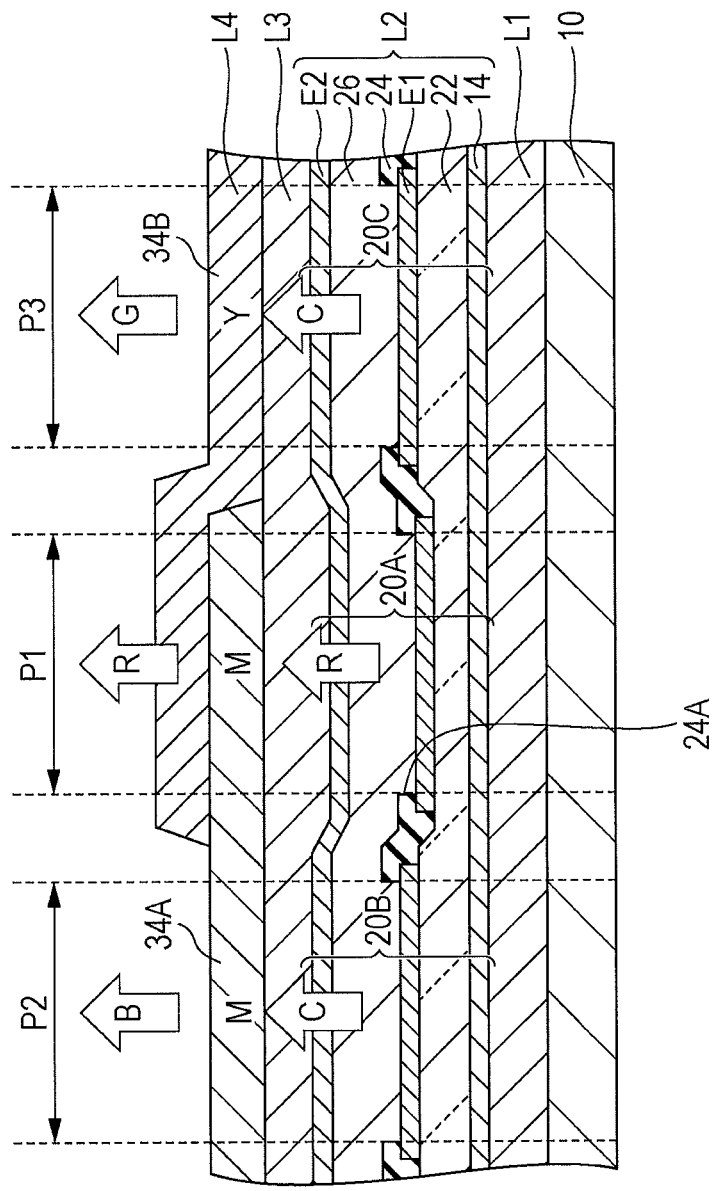
FIG. 5 is a cross-sectional view of a light-emitting device according to Embodiment 2.
Figure 6:
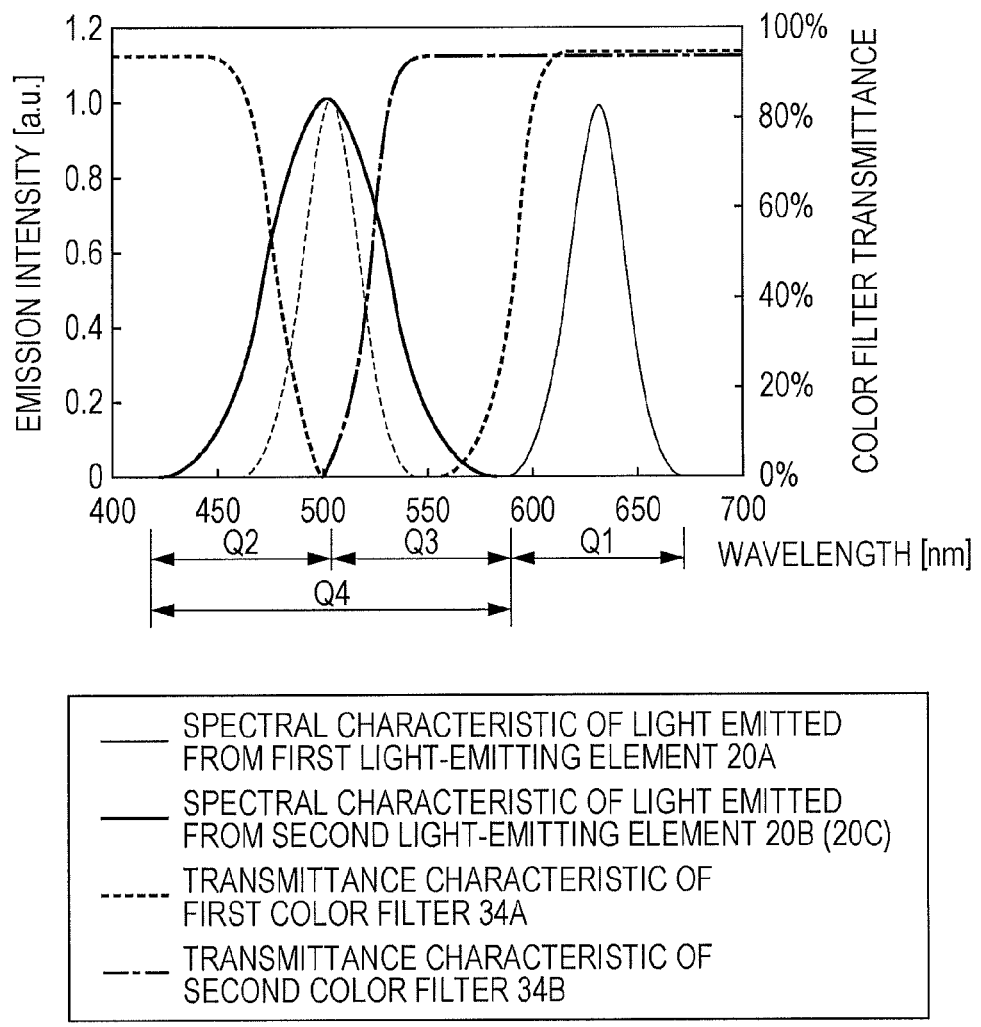
FIG. 6 illustrates optical characteristics of a light-emitting element and a color filter according to Embodiment 2.

FIG. 5 is a cross-sectional view of the light-emitting device 100 according to Embodiment 2. FIG. 6 illustrates spectral characteristics of light emitted from the light-emitting elements 20. As illustrated in FIGS. 5 and 6, the first light-emitting element 20A emits red (R) light in the first wavelength range Q1 (specifically, 620 nm to 750 nm), while the second light-emitting element 20B and the third light-emitting element 20C emit cyan (C) light in the fourth wavelength range Q4 including blue (B) light in the second wavelength range Q2 and green (G) light in the third wavelength range Q3.

FIG. 6 illustrates transmittance characteristics of the first color filter 34A and the second color filter 34B. As illustrated in FIG. 6, the first color filter 34A is a colored layer of magenta (M) which transmits light in the first wavelength range Q1 and the second wavelength range Q2 (i.e., the first color filter 34A absorbs light in the third wavelength range Q3). The second color filter 34B is a colored layer of yellow (Y) which transmits light in the first wavelength range Q1 and the third wavelength range Q3 (i.e., the second color filter 34B absorbs light in the second wavelength range Q2).

As illustrated in FIG. 5, red light from the first light-emitting element 20A in the pixel P1 is transmitted to the light emitting side. Blue light transmitted through the first color filter 34A of magenta, which is a part of cyan light from the second light-emitting element 20B in the pixel P2, is emitted to the light emitting side, while green light transmitted through the second color filter 34B of yellow, which is a part of cyan light from the third light-emitting element 20C in the pixel P3, is emitted to the light emitting side. In other words, also in Embodiment 2, by a combination of two types of light-emitting elements 20 which emit light of different wavelengths and two types of color filters 34 (i.e., the color filters 34A and 34B) which transmit light of different wavelengths, three types of pixels P (i.e., the pixels P1, P2, and P3) which emit light of different wavelengths can be realized. Thus, an effect similar to that in Embodiment 1 is realized.

As illustrated in FIG. 6, in the resonance structure of the second light-emitting element 20B and the third light-emitting element 20C, the optical path length D (the thickness of the optical path adjustment layer 22) is set in a manner such that a spectrum of cyan light in the fourth wavelength range Q4 has a single peak across the second wavelength range Q2 (B) and the third wavelength range Q3 (G). Specifically, as illustrated in FIG. 6, a spectrum of light emitted from the second light-emitting element 20B and the third light-emitting element 20C has a peak in the vicinity of the interface between the second wavelength range Q2 and the third wavelength range Q3. Therefore, if a spectrum of cyan light emitted from the second light-emitting element 20B and the third light-emitting element 20C only covers a small area in the vicinity of the interface between the second wavelength range Q2 and the third wavelength range Q3 as illustrated by a broken line in FIG. 6, it would be difficult to obtain a sufficient amount of light transmitted through the first color filter 34A (i.e., luminance of the pixel P2) and a sufficient amount of light transmitted through the second color filter 34B (i.e., luminance of the pixel P3).

In Embodiment 2, therefore, sizes or optical characteristics of elements in the resonance structure of the second light-emitting element 20B and the third light-emitting element 20C are set so that a spectrum of cyan light emitted from the second light-emitting element 20B and the third light-emitting element 20C covers a wide area including both the second wavelength range Q2 and the third wavelength range Q3 as illustrated in FIG. 6. Specifically, the resonance structure of the second light-emitting element 20B and the third light-emitting element 20C is set in a manner such that a full width at half maximum of the spectrum of cyan light is 50 nm or more and 100 nm or less. A specific structure is described below where the spectrum of cyan light from the second light-emitting element 20B and the third light-emitting element 20C covers a wide area (e.g., where the full width at half maximum is between 50 nm and 100 nm).

In a resonance structure of the light-emitting elements 20, a spectrum of light emission tends to cover a smaller area as the resonance order m increases. With such a tendency into consideration, the optical path length D in the resonance structure of the second light-emitting element 20B and the third light-emitting element 20C is set so that resonance with a resonance order m 2 or less (m≤2) occur, whereby the full width at half maximum of a spectrum of cyan light can be adjusted to between 50 nm and 100 nm.

In addition, in the resonance structure, as the thickness of the second electrode (the transflective layer) E2 increases, a reflectance of the transflective layer increases and a spectrum of light emission tends to cover a smaller area. With such a tendency into consideration, the second electrode E2 is formed to have a thickness of 2 nm or more and 10 nm or less, whereby the full width at half maximum of a spectrum of cyan light can be adjusted to between 50 nm and 100 nm.

As described above, in Embodiment 2, a spectrum of cyan light emitted from the second light-emitting element 20B and the third light-emitting element 20C has a single peak across the second wavelength range Q2 and the third wavelength range Q3. Specifically, the full width at half maximum is adjusted to 50 nm or more and 100 nm or less so that the spectrum of cyan light covers a wide area, whereby a sufficient amount of light transmitted through the first color filter 34A and the second color filter 34B is obtained. Accordingly, the luminance of the pixels P2 and P3 is sufficiently obtained compared with a comparative example illustrated as a broken line in FIG. 6.

Note that while the above description provides an example where the spectrum of cyan light emitted from the second light-emitting element 20B and the third light-emitting element 20C has a single peak across the second wavelength range Q2 and the third wavelength range Q3, a structure may alternatively employed where the second light-emitting element 20B and the third light-emitting element 20C emit cyan light which has a peak in each of the second wavelength range Q2 and the third wavelength range Q3. For example, similarly to an example of Embodiment 1 as illustrated in FIG. 4, the optical path length D in the resonance structure of the second light-emitting element 20B and the third light-emitting element 20C is set so that resonance of a resonance wavelength in the second wavelength range Q2 and resonance of a resonance wavelength of the third wavelength range Q3 occur in parallel.

Modification

Embodiments described above can be variously modified. Specific examples of modification are described hereinafter. Any two or more of the following modifications can be combined as appropriate.

Figure 7:
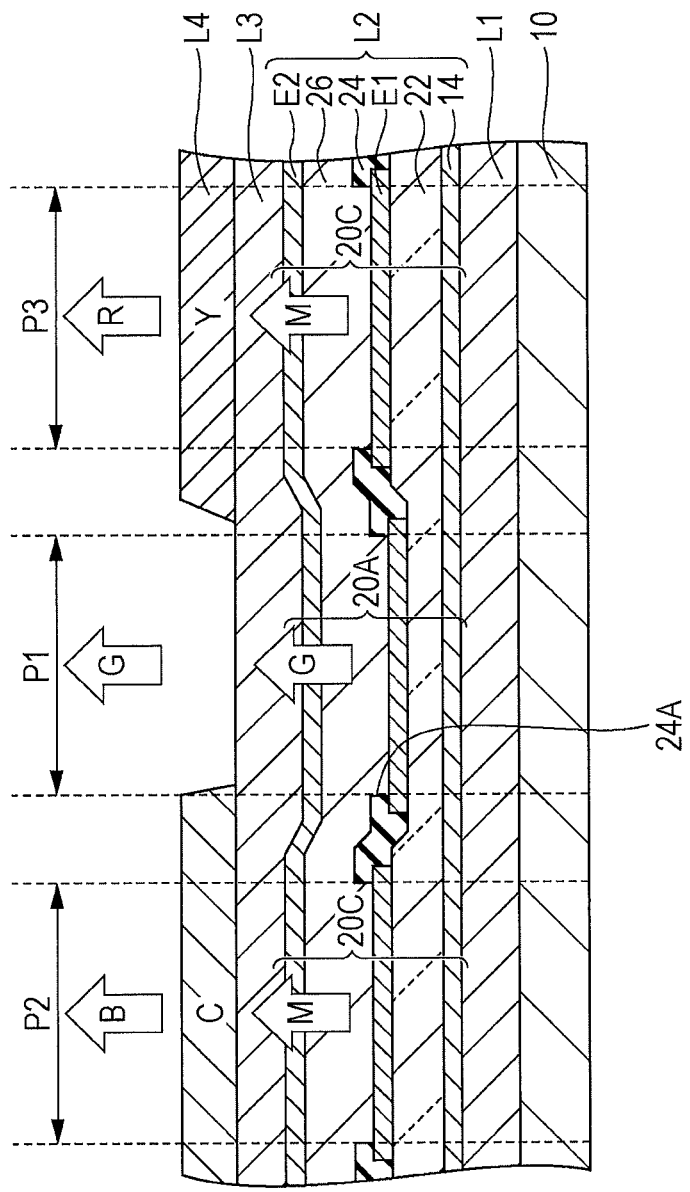
FIG. 7 is a cross-sectional view of a light-emitting device according to a modification example.

(1) In each of the above embodiments, although a structure in which the first light-emitting element 20A overlaps the first color filter 34A and the second color filter 34B is described, a structure illustrated in FIG. 7 in which the first color filter 34A and the second color filter 34B do not overlap the first light-emitting element 20A or a structure in which only one of the first color filter 34A and the second color filter 34B overlaps the first light-emitting element 20A may be employed. In a structure in which neither the first color filter 34A nor the second color filter 34B overlap the first light-emitting element 20A, the first color filter 34A and the second color filter 34B do not necessarily transmit light in the first wavelength range Q1. In a structure in which only one of the first color filter 34A and the second color filter 34B overlaps the first light-emitting element 20A, the other one does not necessarily transmit light in the first wavelength range Q1.

(2) As described above, even if the first light-emitting element 20A overlaps the first color filter 34A or the second color filter 34B, light emitted from the first light-emitting element 20A is not affected. However, if the first color filter 34A overlaps the third light-emitting element 20C, light in the third wavelength range Q3 which is emitted from the third light-emitting element 20C is blocked by the first color filter 34A and if the second color filter 34B overlaps the second light-emitting element 20B, light in the second wavelength range Q2 which is emitted from the second light-emitting element 20B is blocked by the second color filter 34B, which results in reduction in color reproducibility of red, blue, and green. Therefore, a structure for preventing overlapping of the first color filter 34A and the third light-emitting element 20C and overlapping of the second color filter 34B and the second light-emitting element 20B is preferably employed. Specific examples will be described below.

Modification Example A

Figure 8:
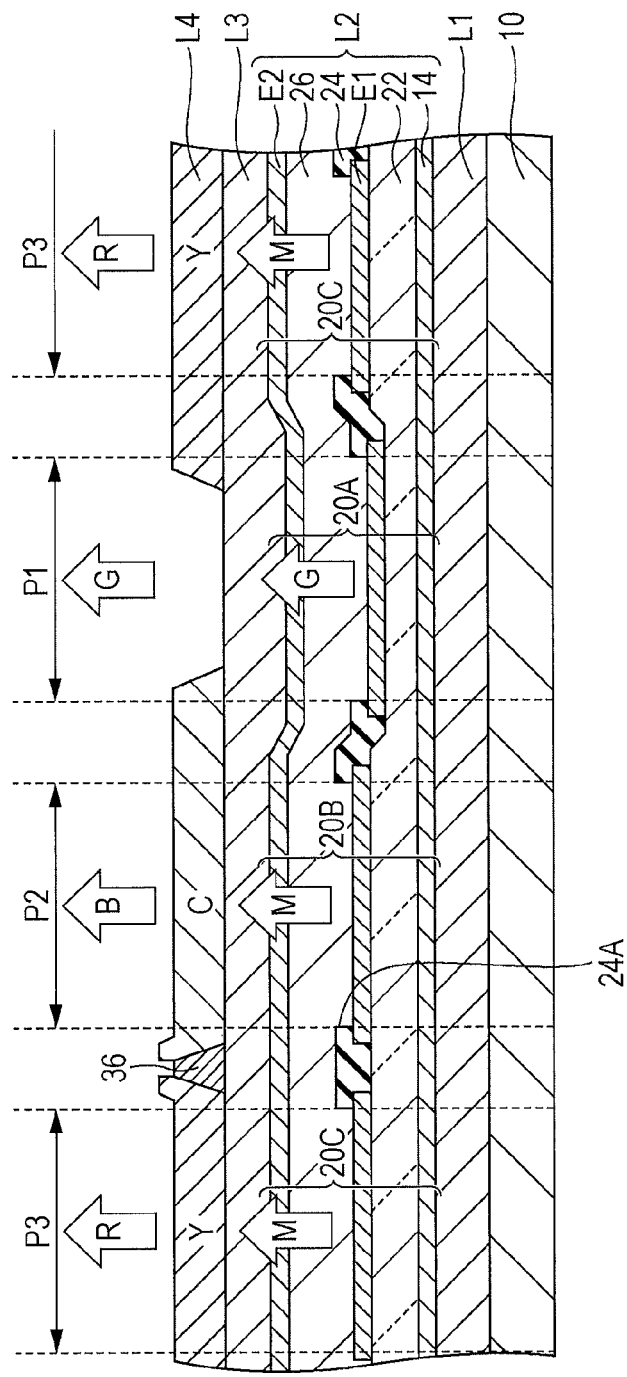
FIG. 8 is a cross-sectional view of a light-emitting device according to a modification example.

FIG. 8 is a cross-sectional view of the light-emitting device 100 according to Modification Example A. As illustrated in a plan view of FIG. 8, a partition 36 is formed between the first color filter 34A and the second color filter 34B, in a region between the pixel P2 and the pixel P3. In a structure of FIG. 8, the partition 36 separates the first color filter 34A and the second color filter 34B between the pixel P2 and the pixel P3, whereby overlapping of the first color filter 34A and the third light-emitting element 20C and overlapping of the second color filter 34B and the second light-emitting element 20B can be prevented.

Modification Example B

Figure 9:
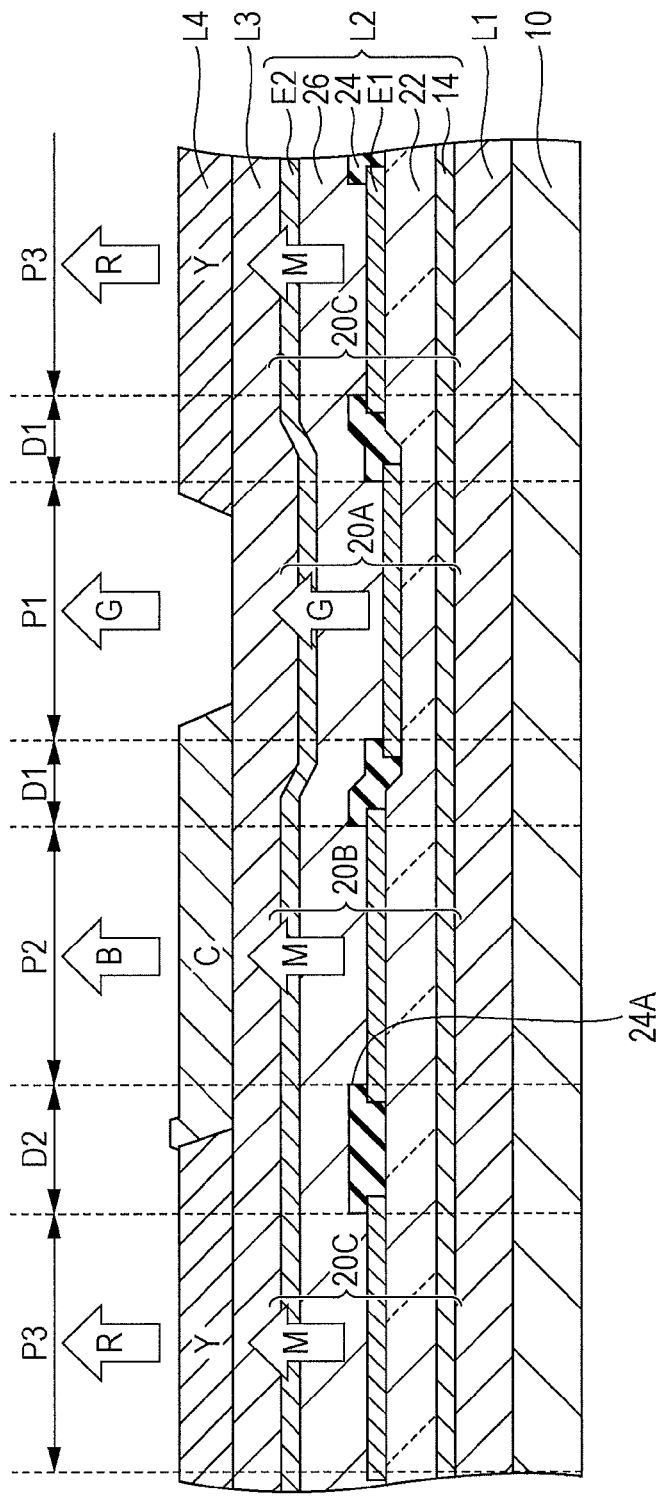
FIG. 9 is a cross-sectional view of a light-emitting device according to a modification example.

FIG. 9 is a cross-sectional view of the light-emitting device 100 according to Modification Example B. As illustrated in FIG. 9, positions of the light-emitting elements 20 are determined in a manner such that a distance D2 between the second light-emitting element 20B and the third light-emitting element 20C (i.e., a distance between the pixel P2 and the pixel P3) is larger than a distance D1 between the first light-emitting element 20A and the second light-emitting element 20B or between the first light-emitting element 20A and the third light-emitting element 20C. With a structure illustrated in FIG. 9, similarly to the case of Modification Embodiment A in FIG. 8, overlapping of the first color filter 34A and the third light-emitting element 20C and overlapping of the second color filter 34B and the second light-emitting element 20B can be prevented.

(3) In each of the above embodiments and examples, the light-emitting functional layer 26 emits white color in the first light-emitting element 20A, the second light-emitting element 20B, and the third light-emitting element 20C; however, the light-emitting layer in the light-emitting functional layer 26 may emit light of different colors between the first light-emitting element 20A and the second light-emitting element 20B (or the third light-emitting element 20C).

(4) In each of the above embodiments and examples, as illustrated in FIG. 1, although the pixels P of the same color (the pixels P1, P2, or P3) are aligned along the Y-direction (in a stripe arrangement), an arrangement of the pixels P is not limited thereto. Specifically, a plurality of pixels P may be arranged as described below. Although the following examples are described with a structure according to Embodiment 1 where the light-emitting elements 20 that emit green and magenta light and the color filters 34 that transmit cyan and yellow light are combined, a combination of wavelength ranges of light emitted from the light-emitting elements 20 and wavelength ranges of light transmitted through the color filters 34 may be changed as appropriate, as described in Embodiment 2.

FIG. 10 illustrates a mosaic arrangement where the pixels P along the X-direction (hereinafter, such a line of the pixels P is referred to as a row) are arranged in a manner such that the colors of the pixels P in each row is moved by one pixel P along the X-direction. FIG. 11 illustrates a delta arrangement where the pixels P are arranged in a manner such that the colors thereof in each row is moved by half pixel P along the X-direction.

Figure 12:
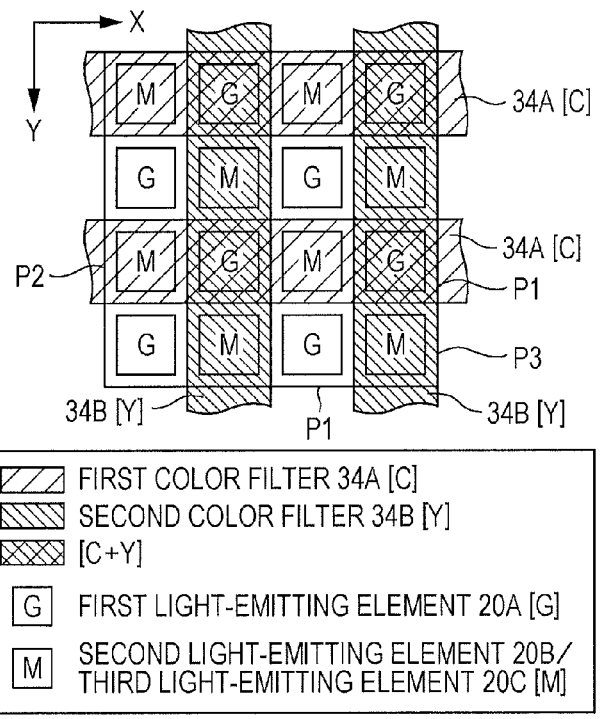
FIG. 12 illustrates an arrangement of color filters.
Figure 13:
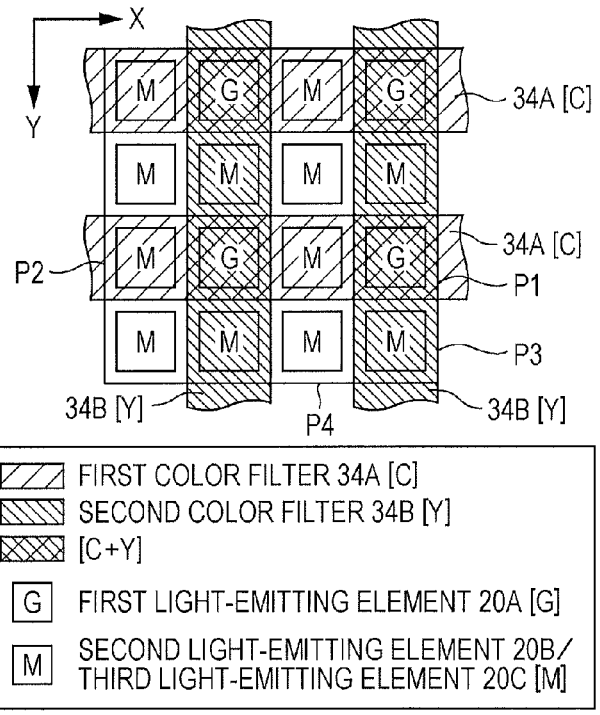
FIG. 13 illustrates an arrangement of color filters.

FIG. 12 illustrates a structure where a plurality of first color filters 34A have band shapes (a straight linear-shape) extending in the X-direction and a plurality of second color filters 34B have band shapes extending in the Y-direction. The first color filters 34A are aligned in the Y-direction with an interval equivalent to one pixel P, whereas the second color filters 34B are aligned in the X-direction with an interval equivalent to one pixel P. A region where the second light-emitting element 20B and the first color filter 34A overlap each other is the blue pixel P2, while a region where the third light-emitting element 20C and the second color filter 34B overlap each other is the red pixel P3. A region where the first light-emitting element 20A, the first color filter 34A, and the second color filter 34B overlap one another is the green pixel P1. Further, a region where neither the first color filter 34A nor the second color filter 34B is formed, the first light-emitting element 20A is formed to serve as the green pixel P1. Note that as illustrated in FIG. 13, in the region where neither the first color filter 34A nor the second color filter 34B is formed, the magenta second light-emitting element 20B (or the third light-emitting element 20C) is formed to serve as a magenta pixel P4. In a structure illustrated in FIG. 12 or FIG. 13 where the first color filter 34A and the second color filter 34B have simple band shapes, a formation process of the color filter 34 can be simplified.

Figure 14:
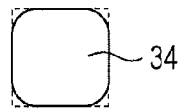
FIG. 14 illustrates a problem in forming a color filter.

Note that in a structure of FIG. 10 and FIG. 11 where the color filters 34 (34A and 34B) are formed to have a top shape corresponding to a shape of the pixel P, parts of the color filter 34 which correspond to four corners of the pixel P are difficult to be formed with high precision. As illustrated in FIG. 14, the corners of the color filter 34 may be rounded, which results in reduction of aperture ratio of the pixels P. In a structure of the above embodiments and examples where the color filter 34 is formed after formation of the light-emitting element 20 (the light-emitting element layer L2), the color filter 34 needs to be formed at low temperatures in order to suppress deterioration of the light-emitting functional layer 26 due to heat; however, a problem of rounded corners of the color filter 34 is particularly evident at low temperatures. In a structure illustrated in FIG. 12 or FIG. 13 (and in FIG. 15 described below) where the first color filter 34A and the second color filter 34B are formed into simple band shapes, the corners of the color filter 34 do not need to follow the shape of the pixel P; therefore, a problem of rounded corners illustrated in FIG. 14 do not occur and an aperture ratio of the pixel P can be sufficiently obtained accordingly.

Figure 15:
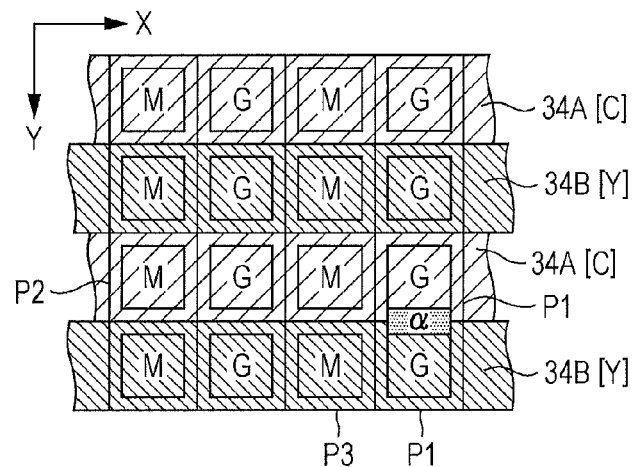
FIG. 15 illustrates an arrangement of color filters.

In a structure in FIG. 15, the band-shaped first color filter 34A extending in the X-direction and the band-shaped second color filter 34B extending in the X-direction are alternately arranged in the Y-direction. In the structure in FIG. 15, similarly to the structures in FIG. 12 or FIG. 13, a region where the second light-emitting element 20B and the first color filter 34A overlap each other is the blue pixel P2, and a region where the third light-emitting element 20C and the second color filter 34B overlap each other is the red pixel P3. In addition, a region where the first light-emitting element 20A overlap the first color filter 34A or the second color filter 34B is the green pixel P1. In the structure in FIG. 15, a single first light-emitting element 20A can be continuous across two neighboring pixels P1 in the Y-direction (e.g., a region a in FIG. 15). Therefore, a high aperture ratio (high luminance) can be realized.

(5) In each of the above embodiments and examples, the second electrode E2 which supplies electrical current to the light-emitting functional layer 26 (a light-emitting layer) also serves as a transflective layer in the resonance structure; however, the second electrode E2 may alternatively be formed of a light-transmitting conductive material, for example, and a transflective layer in the resonance structure may be formed additionally. Also, in each of the above embodiments and examples, the reflective layer 14 in the resonance structure and the first electrode E1 are formed individually; however, the first electrode E1 may alternatively be formed of a light-reflecting conductive material and be used as a reflective layer of the resonance structure.

(6) In each of the above embodiments and examples, although the element formation layer L1, the light-emitting element layer L2, the sealing layer L3, and the wavelength selection layer L4 are stacked on the substrate 10, an alternative structure may be employed where the element formation layer L1, the light-emitting element layer L2, and the sealing layer L3 are formed on the substrate 10, while the wavelength selection layer L4 is formed on another substrate which is to be opposed to the substrate 10 (e.g., on a surface facing the substrate 10).

Electronic Apparatus

Figure 16:
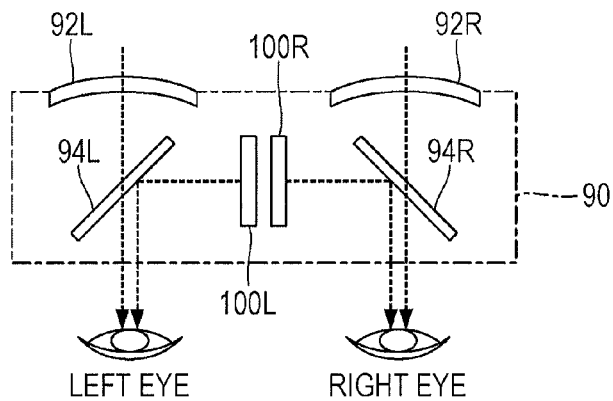
FIG. 16 is a schematic view of a head mount display, which is an example of electronic apparatuses.

The light-emitting device 100 which is described in the above embodiments and examples is preferably used in a display device of various electronic apparatuses. FIG. 16 illustrates a head mounted display device (HMD) 90 including the light-emitting device 100 described in the above embodiments and examples, as an example of an electronic apparatus.

The display device 90 is an electronic apparatus which can be mounted on the head of a user. The display device 90 includes a transparent unit (lens) 92L which faces the left eye of the user, a transparent unit 92R which faces the right eye of the user, a light-emitting device 100L and a half mirror 94L for the left eye, and a light-emitting device 100R and a half mirror 94R for the right eye. The light-emitting device 100L and the light-emitting device 100R are arranged to emit light in the opposite direction from each other. The half mirror 94L for the left eye transmits light which is transmitted through the transparent unit 92L to the left eye of the user and also reflects light which is emitted from the light-emitting device 100L to the left eye of the user. Similarly, the half mirror 94R for the right eye transmits light which is transmitted through the transparent unit 92R to the right eye of the user and also reflects light which is emitted from the light-emitting device 100R to the right eye of the user. Therefore, the user watches an overlapped image of an image via the transparent unit 92L and the transparent unit 92R and an image displayed by the light-emitting devices 100. Further, by displaying stereoscopic images with parallax (an image for the left eye and an image for the right eye) on the light-emitting device 100L and the light-emitting device 100R, the user can feel a stereoscopic effect of displayed images.

Note that an electronic apparatus including the light-emitting device 100 of the above embodiments and examples is not limited to the display device 90 in FIG. 16. For example, the light-emitting device according to the invention is preferably used for an electronic view finder (EVF) which is used for an image taking device such as a video camera or a still camera. Further, the light-emitting device according to the invention can be used in various electronic apparatuses such as a cell phone, a mobile information terminal (such as a smartphone), a monitor for a television, a personal computer, or the like, and a car navigation apparatus.

The entire disclosure of Japanese Patent Application No. 2014-151564, filed Jul. 25, 2014 is expressly incorporated by reference herein.

What is claimed is:

1. A light-emitting device, comprising:
a first pixel;
a second pixel; and
a third pixel,
wherein the first pixel includes a first light-emitting element that emits light in a first wavelength range,
wherein the second pixel includes a second light-emitting element that emits light in a fourth wavelength range that is different from the first wavelength range and that includes a second wavelength range and a third wavelength range and a first color filter that transmits light in the second wavelength range emitted from the second light-emitting element, and
wherein the third pixel includes a third light-emitting element that emits light in the fourth wavelength range and a second color filter that transmits light in the third wavelength range emitted from the third light-emitting element.

2. The light-emitting device according to claim 1,
wherein the first light-emitting element, the second light-emitting element, and the third light-emitting element include a resonance structure in which a reflective layer and a transflective layer face each other with a light-emitting layer between the reflective layer and the transflective layer.

3. The light-emitting device according to claim 2,
wherein an optical path length between the reflective layer and the transflective layer in the second light-emitting element and the third light-emitting element is the same and set in a manner such that in a light spectrum of light emitted from the second light-emitting element and the third light-emitting element, a peak corresponding to a first resonance order is located in the second wavelength range, and a peak corresponding to a second resonance order that is different from the first resonance order is located in the third wavelength range.

4. The light-emitting device according to claim 2,
wherein the second light-emitting element and the third light-emitting element emit light of a spectrum with a single peak across the second wavelength range and the third wavelength range.

5. The light-emitting device according to claim 4,
wherein a full width at half maximum of the spectrum is 50 nm or more and 100 nm or less.

6. The light-emitting device according to claim 4,
wherein an optical path length between the reflective layer and the transflective layer in the second light-emitting element and the third light-emitting element corresponds to a resonance order of 2 or less.

7. The light-emitting device according to claim 4,
wherein a film thickness of the transflective layer is 2 nm or more and 10 nm or less.

8. The light-emitting device according to claim 1,
wherein at least one of the first color filter and the second color filter transmits light in the first wavelength range and overlaps the first light-emitting element.

9. The light-emitting device according to claim 1, further comprising a partition formed between the first color filter and the second color filter.

10. The light-emitting device according to claim 1,
wherein a distance between the second light-emitting element and the third light-emitting element is greater than a distance between the first light-emitting element and the second light-emitting element and a distance between the first light-emitting element and the third light-emitting element.

11. An electronic apparatus comprising the light-emitting device according to claim 1.

12. An electronic apparatus comprising the light-emitting device according to claim 2.

13. An electronic apparatus comprising the light-emitting device according to claim 3.

14. An electronic apparatus comprising the light-emitting device according to claim 4.

15. An electronic apparatus comprising the light-emitting device according to claim 5.

16. An electronic apparatus comprising the light-emitting device according to claim 6.

17. An electronic apparatus comprising the light-emitting device according to claim 7.

18. An electronic apparatus comprising the light-emitting device according to claim 8.

19. An electronic apparatus comprising the light-emitting device according to claim 9.

20. An electronic apparatus comprising the light-emitting device according to claim 10.

\* \* \* \* \*